(12) United States Patent
Lee (10) Patent No.: US 7,609,088 B2
(45) Date of Patent: Oct. 27, 2009

(54) PROGRAMMABLE LOGIC ARRAY

(75) Inventor: Dong-Gyu Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/295,634

(22) Filed: Dec. 7, 2005

(65) Prior Publication Data

US 2006/0125519 A1 Jun. 15, 2006

(30) Foreign Application Priority Data

Dec. 9, 2004 (KR) .................... 10-2004-0103716

(51) Int. Cl.
*H03K 19/177* (2006.01)
(52) U.S. Cl. .......................... 326/41; 326/38
(58) Field of Classification Search ............. 326/37–41, 326/46
See application file for complete search history.

(56) References Cited

U.S. PATENT DOCUMENTS 5,083,047 A * 1/1992 Horie et al. .................... 326/45
5,511,173 A 4/1996 Yamaura et al.
5,811,988 A 9/1998 Ditlow et al.
6,433,577 B1 * 8/2002 Wang et al. .................... 326/37
7,065,732 B1 * 6/2006 Konrad et al. ................. 716/16
2002/0063578 A1 * 5/2002 Song .......................... 326/40

FOREIGN PATENT DOCUMENTS

| JP | 63-097014 | 4/1988 |
|----|-----------|--------|
| JP | 03-007425 | 1/1991 |
| JP | 05-347552 | 12/1993 |

* cited by examiner

*Primary Examiner*—Don P Le
(74) *Attorney, Agent, or Firm*—Harness, Dickey & Pierce, P.L.C.

(57) ABSTRACT

A programmable logic array (PLA) which may include an AND-plane receiving first input signals and generating logic product signals based on the first input signals, and an OR-plane receiving the logic product signals and a second input signal and generating a logic sum signal based on the logic product signals.

16 Claims, 5 Drawing Sheets

Fig. 1

(Conventional Art)

Fig. 2

(Conventional Art)

| CLK | F2 | F1 | $Y_1^*$ | Note |
|---|---|---|---|---|
| 0 (Precharge) | 1 | 1 | 0 | $Y_1^*=0$ |
| 1 (Evaluation) | 1 | Don't care | 0 | $Y_1^*=0$ |
| | 0 | 1 | 0 | $Y_1^*=F_1^*$ |
| | 0 | 0 | 1 | |

| a | $Y_2$ | $Y_1^*$ | F | Note |
|---|---|---|---|---|
| 0 | Don't care | 0 | 1 | $F=Y_1$ |
|   | Don't care | 1 | 0 |  |
| 1 | 0 | 0 | 1 | $F=Y_1$ |
|   | 0 | 1 | 0 |  |
|   | 1 | 0 | 1 | F=1 |
|   | 1 | 1 | 1 |  |

PROGRAMMABLE LOGIC ARRAY

PRIORITY STATEMENT

This application claims priority from Korean Patent Application No. 2004-103716, filed on Dec. 9, 2004, the contents of which is herein incorporated by reference in its entirety.

BACKGROUND

1. Field of Invention

The example embodiments presented for the invention generally relate to a programmable logic array, an OR-plane, an enable circuit, a discharge device, and a method of performing a logic function.

2. Description of Related Art

A programmable logic array (hereinafter, referred to as a "PLA") may include an AND-plane and/or an OR-plane. Unlike programmable read-only memory (PROM), the AND-plane may express a certain logic product based on an input, and the OR-plane may embody logic sums of the previous logic product.

Figure 1:
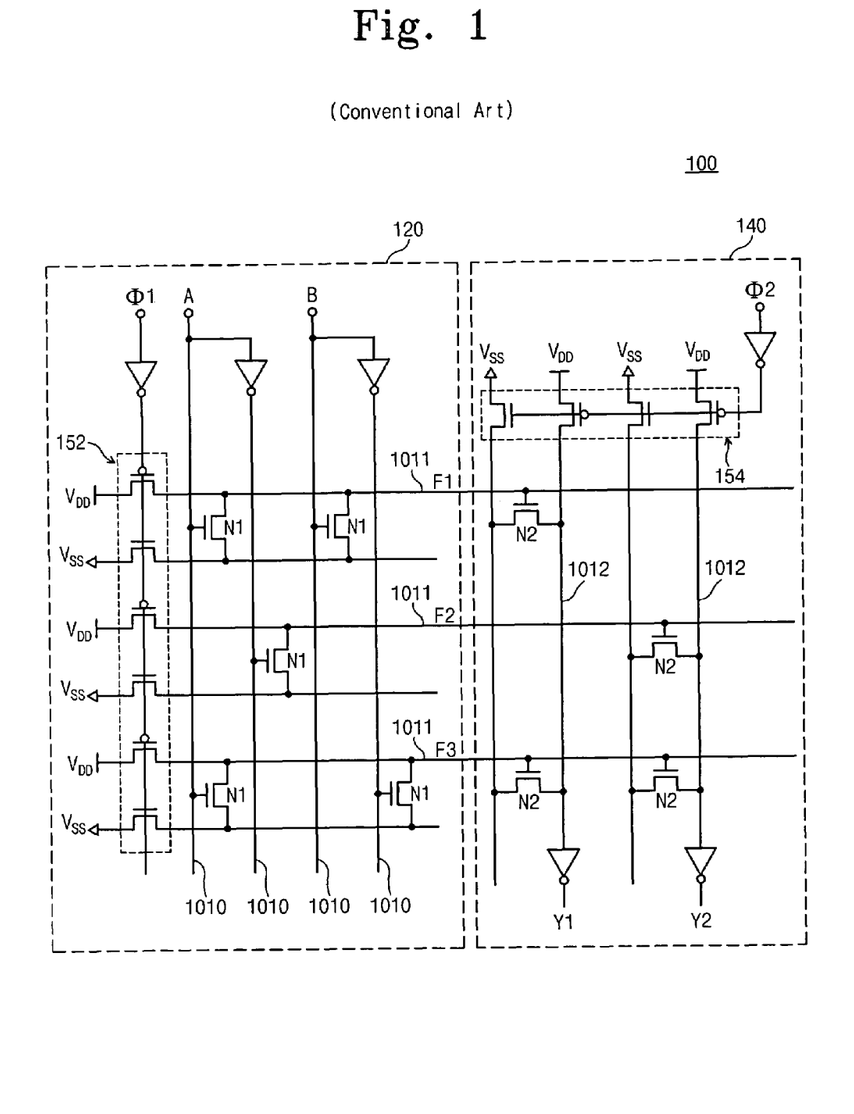
FIG. 1 is a circuit diagram illustrating a programmable logic array according to a conventional art.
Figure 2:
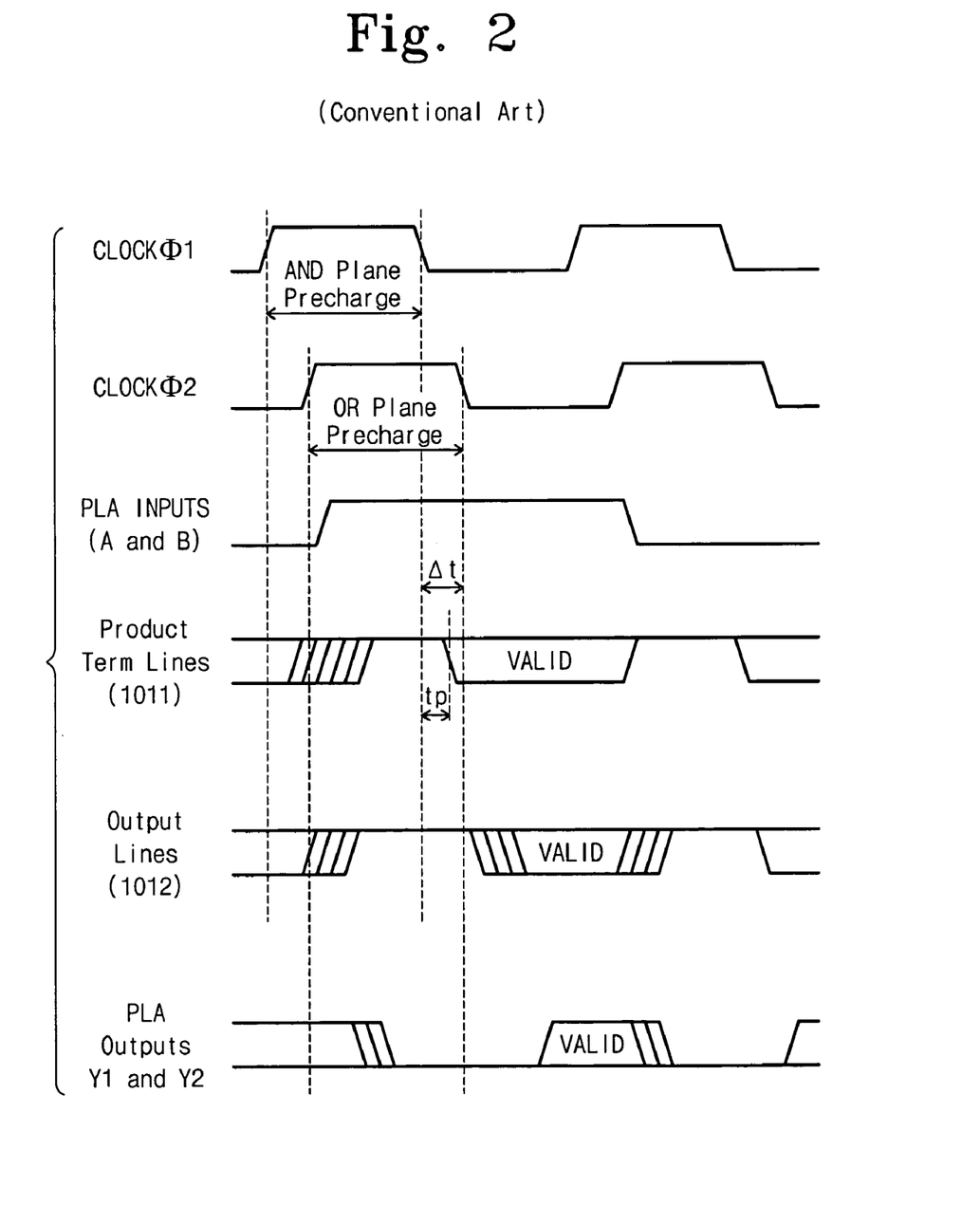
FIG. 2 is a timing diagram illustrating an operation of the programmable logic array of FIG. 1.

FIG. 1 is a schematic circuit diagram illustrating a PLA according to the conventional art. FIG. 2 is a timing diagram illustrating an operation of the PLA of FIG. 1.

Referring to FIG. 1, the PLA 100 includes an AND-plane 120 and an OR-plane 140. The AND-plane 120 receives input signals (A, A*, B, and B*) through input lines 1010 to create logic product signals F1, F2, and F3 carried on product term lines 1011. The OR-plane 140 creates output signals Y1 and Y2 on output lines 1012 based on the logic product signals F1, F2, and F3 of the AND-plane 120.

The PLA 100 may be operated based on a first clock signal Φ1 clocking the AND-plane 120 and a second clock signal Φ2 clocking the OR-plane 140. A pair of PMOS and NMOS transistors 152 of a first group connect the product term lines 1011 to a power voltage $V_{DD}$ and ground voltage $V_{SS}$. The transistors 152 charge or discharge the product term lines 1011 based on a logic state of the first clock signal Φ1. A pair of PMOS and NMOS transistors 154 of a second group connect the output lines 1012 to a power voltage $V_{DD}$ and ground voltage $V_{SS}$. The transistors 154 charge or discharge the output lines 1012 based on a logic state of the second clock signal Φ2.

NMOS transistors N1 of the AND-plane 120 determine the logic product signals F1, F2, and F3 of the respective product term lines 1011. For example, F1=A*B*, F2=A, and F3=A*B in FIG. 1. In this case, A* and B* represent inversion signals of A and B, respectively. NMOS transistors N2 of the OR-plane 140 determine the logic sum signals Y1, and Y2 of the respective output lines 1012. For example, Y1=F1+F3, and Y2=F2+F3 in FIG. 1.

Referring to FIGS. 1 and 2, the first clock signal Φ1 is set to a high level state during a precharge time of the AND-plane 120. During this precharge time, product term lines 1011 are precharged to a high level state. The second clock signal Φ2 is set to a high level state during a precharge time of the OR-plane 140. During this precharge time, output lines 1012 are precharged to a high level state.

An evaluation time for the AND-plane 120 occurs when the first clock signal Φ1 changes to a low level state. After a predetermined delay time tp from the first clock signal change, the level state of the product term may be determined. The second clock signal Φ2 changes to a low level state after a time delay Δt from the change of the first clock signal Φ1. In this case, the level state of output lines 1012 may be determined after the time delay Δt.

The PLA according to a conventional art has difficulty controlling the delay times tp and Δt when the first and second clock signals Φ1 and Φ2 run at higher frequencies. Since most programmable logic according to the conventional art are designed irrespective of an input signal, an operation time for an entire PLA is determined by the most delayed input signal. Accordingly, the conventional PLA has a disadvantage of having a longer operation time for delayed input signals.

SUMMARY

A non-limiting example embodiment of the present invention is directed to a programmable logic array (PLA). The PLA may include an AND-plane receiving first input signals and generating logic product signals based on the first input signals. The PLA may include an OR-plane receiving the logic product signals and a second input signal and generating a logic sum signal based on the logic product signals.

Another non-limiting example embodiment of the present invention is directed to an OR-plane. The OR-plane may include a receiving circuit receiving logic product signals and an input signal. The OR-plane may include a generating circuit generating a logic sum signal based on the logic product signals.

Another non-limiting example embodiment of the present invention is directed to an enable circuit. The enable circuit may include a first switching device connecting a power terminal and an output terminal and charging the output terminal based on a first signal. The enable circuit may include a second switching device connecting a ground terminal and the output terminal and discharging the output terminal to a ground voltage level based on a second signal. The enable circuit may include a control circuit generating the first signal or second signal based on a logic sum signal.

Another non-limiting example embodiment of the present invention is directed to a discharge device. The discharge device may include a first transistor including a gate receiving a logic sum signal, a source connected to an output terminal, and a drain. The discharge device may discharge the output terminal based on the logic sum signal. The discharge device may include a second transistor including a gate receiving an input signal, a source connected to the drain of the first transistor, and a drain connected to a ground terminal. The discharge device may discharge the output terminal based on the input signal.

Another non-limiting example embodiment of the present invention is directed to a method of performing a logic function. The method may include receiving input signals including first input signals and a second input signal. The method may include generating logic product signals based on the first input signals. The method may include generating a logic sum signal based on the logic product signals. The method may include varying the logic sum signal according to a logic state of the second input signal.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments of the present invention.

DETAILED DESCRIPTION OF A NON-LIMITING EXAMPLE EMBODIMENT

As will be shown in further detail below, an example embodiment of the present invention may provide a programmable logic array (PLA) having a reduced sensitivity to a delayed input signal. In other words, the total operation time for performing a logic function by the PLA is not as adversely affected by delays in the reception of an input signal. The example PLA may have reduced power consumption from a decreased AND-plane complexity, less power for switching NMOS transistors in the AND-plane, and/or reduction of power consumption during a standby time. Further, the example PLA may operate with a faster speed.

Figure 3:
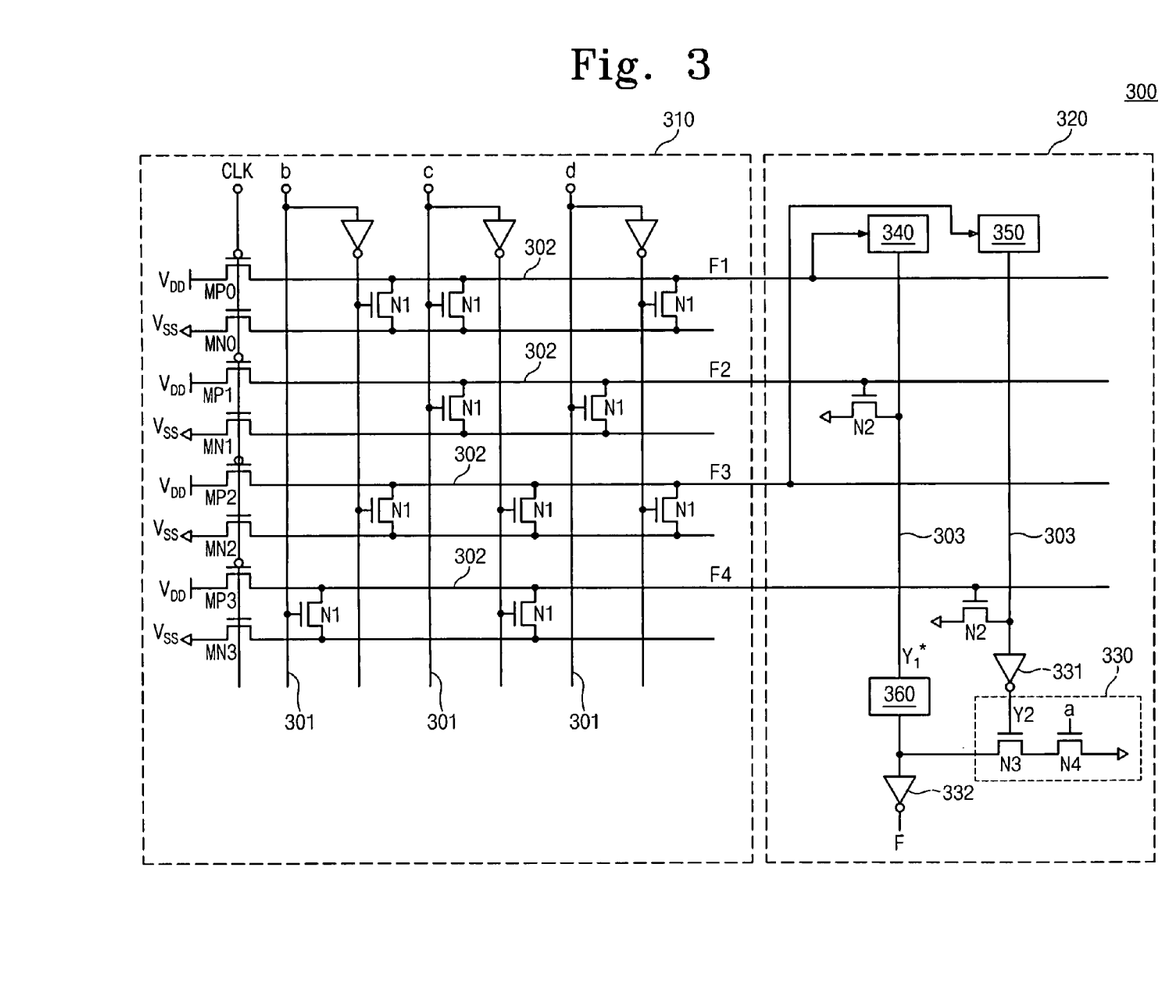
FIG. 3 is a circuit diagram illustrating an example embodiment of a programmable logic array according to the present invention.

FIG. 3 is a circuit diagram illustrating a PLA according to an example embodiment of the present invention. In general and as to be described below, the programmable logic array 300 may include an AND-plane 310 and an OR-plane 320. In a non-limiting example embodiment, the programmable logic array 300 may perform a logic function as follows.

$$F=(bc^*d)+(c^*d^*)+(abcd)+(ab^*c)$$

where, F1=bc*d, F2=c*d*, F3=bcd, and F4=b*c.

An input signal "a" may be delayed in F3 and F4. In such a case, signals F1 and F2 may be designated as not subject to the signal "a", while signals F3 and F4 may be designated as subject to the delayed input signal "a". While the input signals b, c, and d may be inputted to the AND-plane 310, the delayed input signal "a" may be instead inputted to the OR-plane 320.

The AND-plane 310 receives a clock signal CLK via the pairs of PMOS and NMOS transistors MP0 and MN0. The PMOS transistors MP0 connect the product term lines 302 to the voltage source $V_{DD}$ and precharge each product term line 302 to a high level state when the clock signal CLK is at a low level state. The NMOS transistors MN0 connect the product term lines 302 to the common ground $V_{ss}$ via the NMOS transistors N1. A particular product term line 302 becomes discharged when a NMOS transistor N1 connected to the product term line 302 is activated and the clock signal CLK is at a high level state, thereby activating the NMOS transistor MN0.

The AND-plane 310 may receive a plurality of input signals (b, b*, c, c*, d, and d*) that does not include a delayed input signal (a). The AND-plane 310 may include a plurality of NMOS transistors N1 connecting input lines 301 to the product term lines 302. The number of input signals and the particular arrangement of the NMOS transistors N1 may vary to reflect the appropriate calculation for a desired predetermined logic function, so the number of input signals and transistor arrangement as shown in FIG. 3 is not intended to be limiting.

When the clock signal CLK reaches a low level state, the product term lines 302 of the AND-plane may be precharged to a high level state. When the clock signal CLK reaches a high level state, the product term lines 302 of the AND-plane 310 may generate logic product signals according to the input signals (b, b*, c, c*, d, and d*). For example, in FIG. 3, a first logic product signal F1 may be bc*d, a second logic product signal F2 may be c*d*, a third logic product signal F3 may be bcd, and a fourth logic product signal F4 may be b*c. The arrangement of the NMOS transistors N1 may reflect which input signals are represented in each logic product signal.

Further, the first and second logic product signals F1 and F2 may be designated as signals that are not subject to the delayed input signal (a), and the third and fourth logic product signals F3 and F4 may be designated as signals that are subject to the delayed input signal (a).

The OR-plane 320 may include NMOS transistors N2 connected to the output lines 303. The NMOS transistors N2 may discharge the output lines 303 based on corresponding logic product signals, e.g. F2 and F4. For example, a NMOS transistor N2 may discharge an output line 303 when a logic product signal F2 reaches a high level state. The number and arrangement of the NMOS transistors N2 may vary to reflect the appropriate calculation for a desired logic function, so the number and arrangement of transistors as shown in FIG. 3 is not intended to be limiting.

The OR-plane 320 may generate a first logic sum signal (Y1*) based on logic product signals, e.g. F1 and F2, that are not subject to the delayed input signal (a). A first output line carries the logic sum signal (Y1*). Moreover, the OR-plane 320 may generate a second logic sum signal (Y2*) based on logic product signals, e.g. F3 and F4, that are subject to the input signal (a). A second output line carries the second logic sum signal (Y2*). An inverter 331 inverts a logic state of the second output line to produce the second logic sum signal (Y2).

Figure 4:
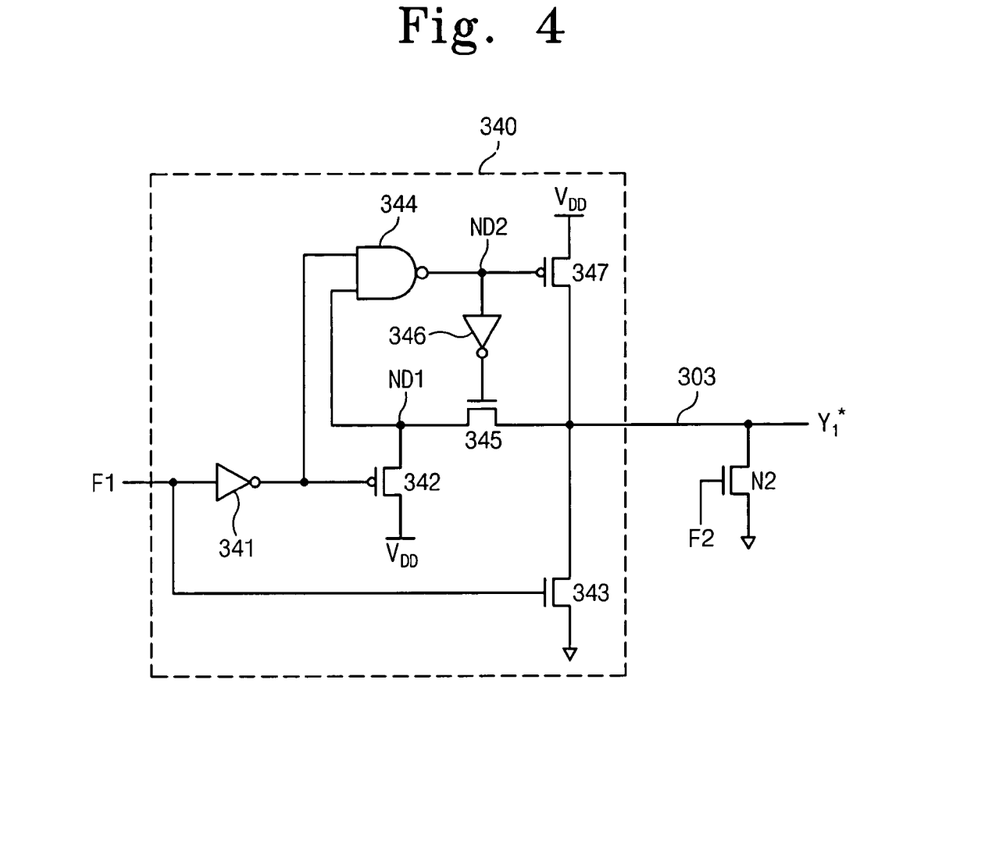
FIG. 4 is a circuit diagram illustrating an example embodiment of a first enable circuit of FIG. 3.
Figure 6:
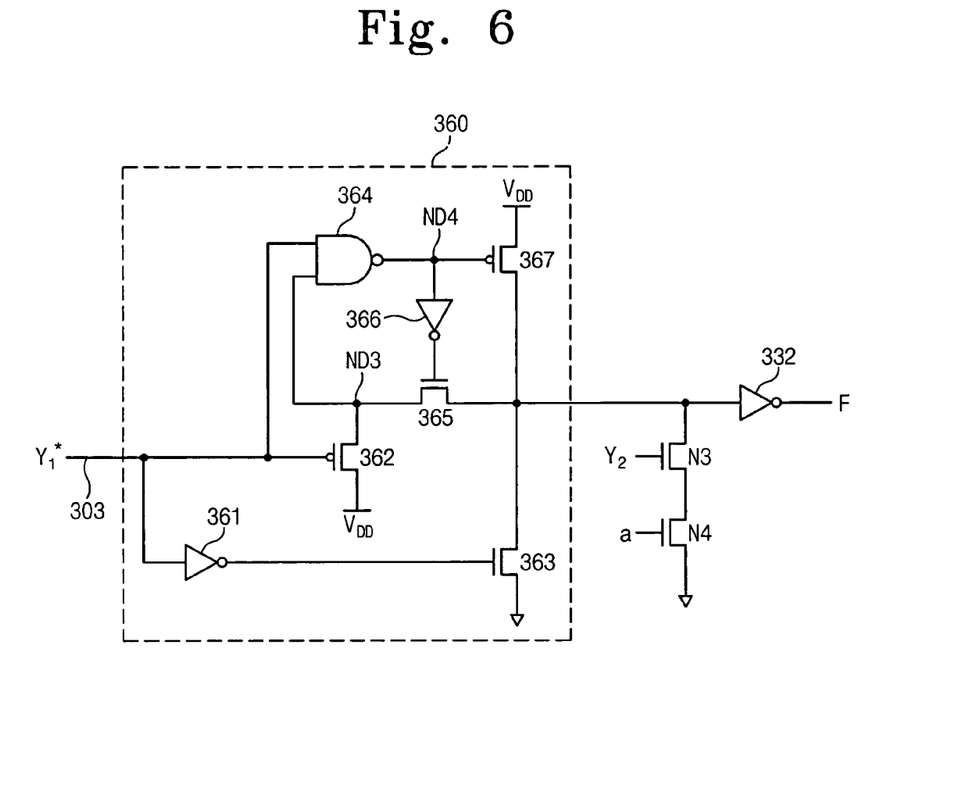
FIG. 6 is a circuit diagram illustrating an example embodiment of a third enable circuit of FIG. 3.

With reference to FIG. 3, the OR-plane 320 may further include enable circuits 340, 350, and 360, which may be connected to the output lines 303. The first enable circuit 340 may charge or discharge a first output line based on a first logic product signal, e.g. F1. The second enable circuit 350 may charge or discharge a second output line based on a third logic product signal, e.g. F3. The third enable signal 360 may charge or discharge an output signal based on the first logic sum signal (Y1*). The first and second enable circuits 340 and 350 may have the same structure. FIGS. 4 and 6, discussed below, provide an example description of the construction and operation of the first and second enable circuits 340 and 350 and the third enable circuit 360, respectively.

The OR-plane 320 may include a discharge device 330 for discharging an output terminal of the third enable circuit 360 based on the second logic sum signal Y2 and/or the delayed input (a). The discharge device 330 may include a NMOS transistor N3 for discharging the output terminal of the third enable circuit 360 based on the second logic sum signal Y2. The discharge device 330 may include a NMOS transistor N4 for discharging the output terminal of the third enable circuit 360 based on the delayed input signal (a). The discharge device 330 may discharge the output terminal of the third enable circuit 360 if the NMOS transistors N3 and N4 are both activated by the second logic sum signal Y2 and the delayed input signal (a) reaching a high level state.

Additionally, the OR-plane 320 may further include an inverter 332 inverting an output signal of the third enable circuit 360.

FIG. 4 is a circuit diagram illustrating an example embodiment of a first enable circuit 340 of FIG. 3. With reference to FIG. 4, the first enable circuit 340 may include inverters 341 and 346, PMOS transistors 342 and 347, a NAND gate 344, and NMOS transistors 343 and 345. The PMOS transistor 342 may have a gate receiving a first logic product signal, e.g. F1, through the inverter 341, a source connected to a power voltage $V_{DD}$, and a drain connected to an internal node ND1. Input terminals of the NAND gate 344 may be electrically connected to an output terminal of the inverter 341 and the internal node ND1, respectively. The PMOS transistor 347 may have a gate electrically connected to an output terminal of the NAND gate 344, i.e. node ND2, a source connected to the power voltage $V_{DD}$, and a drain electrically connected to the output line 303. The NMOS transistor 343 may have a gate receiving a value of the first logic product signal F1, a drain electrically connected to the output line 303, and a grounded source. The NMOS transistor 345 may be controlled by an output signal of the inverter 346 and electrically connected between the node ND1 and the output line 303. An input terminal of the inverter 346 may be electrically connected to the node ND2.

Figure 5:
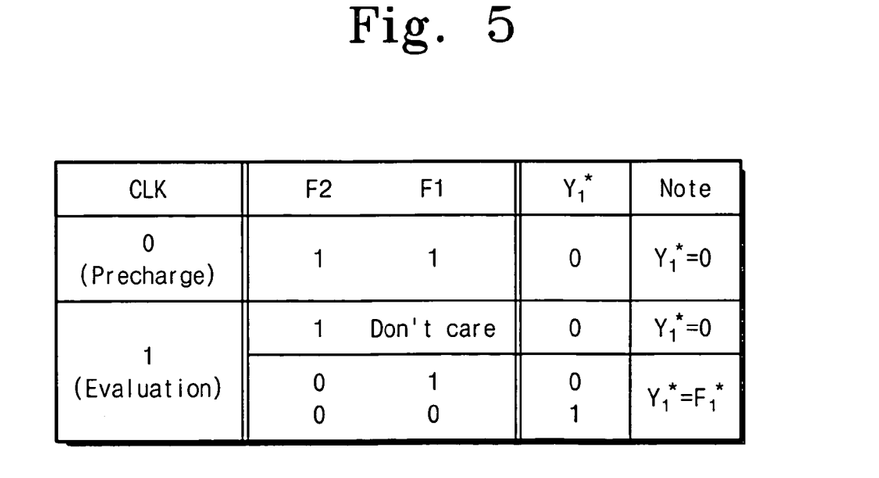
FIG. 5 is a table showing a logic state of the signals of FIG. 4.

FIG. 5 shows a logic state of the first logic sum signal (Y1*) according to an operation of the first enable signal circuit 340, as illustrated in FIG. 4. In FIG. 5, "1" represents a logic high state, and "0" represents a logic low state.

With reference to FIGS. 4 and 5, when the clock signal CLK reaches a low level state during a precharge time, the first and second logic product signals F1 and F2 reach a high level state. At this time, the first logic sum signal (Y1*) reaches a low level state.

When the clock signal CLK reaches a logical high state during an evaluation time, the first logic sum signal (Y1*) may vary based on logic states of the first and second logic product signals F1 and F2. When the second logic product signal F2 reaches a high level state, the first logic sum signal (Y1*) reaches a low level state irrespective of the first logic product signal F1. With reference to FIG. 4, when the second logic product signal F2 reaches a high level state, the NMOS transistor N2 may be activated to connect the first logic sum signal (Y1*) to the ground voltage $V_{SS}$. Accordingly, the first logic sum signal (Y1*) is a low level state for this combination of clock signal CLK and logic product signals.

On the other hand, when the second logic product signal F2 reaches a low level state, a logic state of the first logic sum signal (Y1*) may vary based on a logic state of the first logic product signal F1. If the first logic product signal F1 reaches a high level state, the NMOS transistor 343 of the first enable circuit 340 may be activated to connect the first logic sum signal (Y1*) to the grounded source. Thus, the first logic sum signal (Y1*) may become a low level state. If the first logic product signal F1 is changed from a high level state to a low level state, however, an output of the inverter 341 may become a high level state. As a result, the two inputs of the NAND gate 344 may become a high level state. At this time, since an output of the NAND gate 344 may be a low level state, the NMOS transistor 345 and the PMOS transistor 347 become activated. At this time, the first logic sum signal (Y1*) becomes a high level state. Therefore, if the second logic product signal F2 reaches a low state, the first logic sum signal (Y1*) may become the same logic level as an inversion signal (F1*) of the first logic product signal.

The second enable circuit 350 of FIG. 3 may have the same or similar construction and operation as the first enable circuit 340.

FIG. 6 is a circuit diagram illustrating an example embodiment of a third enable circuit 360 of FIG. 3. The third enable circuit 360 may receive the first logic sum signal (Y1*) and charge or discharge an output terminal based on a logic state of the first logic sum signal (Y1*).

With reference to FIG. 6, the example third enable circuit 360 may have the same construction as the first enable signal of FIG. 4 except that the inverter 361 may not be connected to PMOS transistor 362 and may be connected instead to NMOS transistor 363.

Figure 7:
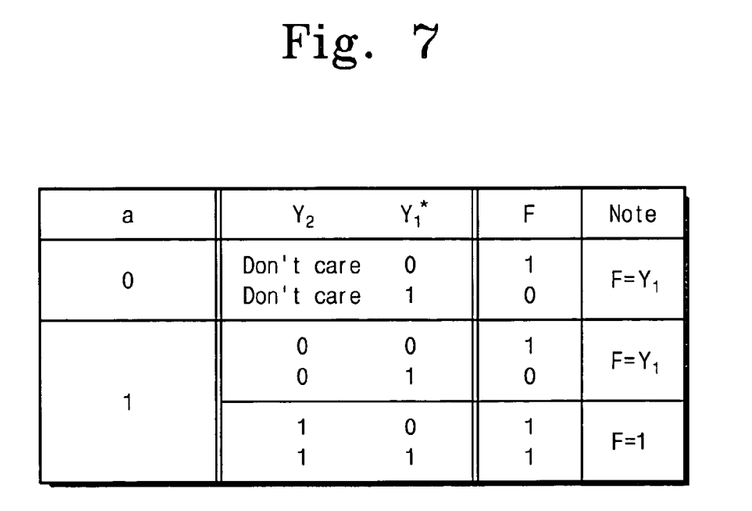
FIG. 7 is a table showing a logic state of signals of FIG. 6.

FIG. 7 shows a logic state of an output signal F according to an operation of the third enable circuit 360, as illustrated in FIG. 6.

With reference to FIGS. 6 and 7, when the delayed input signal (a) reaches a low level state, the output signal F may output an inversion signal (Y1) of the first logic sum signal (Y1*) irrespective of the second logic sum signal (Y2). That is, F equals Y1. With reference to FIG. 6, when the first logic sum signal (Y1*) reaches a low level state, the NMOS transistor 363 may be activated connecting an output terminal to a grounded source. Accordingly, an output terminal of the third enable circuit 360 may become a low level state. For this combination of first logic sum signal (Y1*), second logic sum signal (Y2*), and delayed input signal (a), the output signal F may reach a high level state. Then, if the first logic sum signal (Y1*) changes from a low level to a high level state, the two input terminals may reach a high level state. Accordingly, an output of the NAND gate 364 may become a low level state. At this time, since the PMOS transistor 367 becomes activated to connect the output terminal to a voltage source, an output terminal of the third enable circuit 360 may reach a high level state. In this case, the output signal F reaches a low level state.

When the late input signal (a) reaches a high level state, the output signal F may have different cases. If the second logic sum signal (Y2) reaches a low level state, the output signal F outputs an inversion signal (Y1) of the first logic sum signal (Y1*). That is, F equals Y1. This result may similarly occur in the case where the output signal F is generated when the input signal (a) is a low level state.

When the input signal (a) and the second logic sum signal (Y2) reach a high level state, the output signal F may be a high level state, i.e. F equals "1". For this particular combination of input signal (a) and second logic sum signal (Y2), the output terminal of the third enable circuit 360 may be discharged through the NMOS transistors N3 and N4. The output terminal reaches a low level state, and the output signal F through the inverter 332 may reach a high level state.

The logic function F=(bc*d)+(c*d*)+(abcd)+(ab*c) may be considered in a different manner. Since F1=bc*d, F2=c*d, F3=bcd, and F4=b*c in the logic function, then F=F1+F2+aF3+aF4=F1+F2+a(F3+F4). Where Y1*=(F1+F2)* and Y2=F3+F4, then accordingly, F=Y1+aY2. In this case, if a=0, F=Y1, and if a=1, F=Y1+Y2. Also, if a=1 and Y2=0, F=Y1. If a=1 and Y2=1, F=Y1+1=1. These results are the same as the logic state of the output signal F, as illustrated in FIG. 7.

The programmable logic array according to an example embodiment of the present invention may generate a logic sum signal of an AND-plane according to input signals irrespective of a delayed input signal. Depending on the result of the logic sum signal of the AND-plane, a logic sum signal of the OR-plane may be generated. Also, the programmable logic array may generate an output signal by calculating the logic sum signal and the delayed input signal.

Changes may be made to the example embodiment of the present invention in light of the above detailed description. In general, in the following claims, the terms used should not be construed to limit the invention to the specific embodiments disclosed in the specification and the claims, but should be construed to include all methods and devices that are in accordance with the claims. It will be understood by those of ordinary skill in the art that various changes in form and details may be made therein without departing from the spirit and scope of the example embodiment of the present invention, as defined by the following claims. Accordingly, the invention is not limited by the disclosure, but instead its scope is to be determined by the following claims.

What is claimed is:

1. A programmable logic array comprising:
   an AND-plane receiving first input signals and generating logic product signals based on the first input signals; and
   an OR-plane receiving the logic product signals and a delayed second input signal inputted later than the first input signals and generating a logic sum signal based on the logic product signals.

2. The programmable logic array of claim 1, wherein the OR-plane includes:
   a logic circuit varying the logic sum signal according to a logic state of the delayed second input signal.

3. The programmable logic array of claim 1, wherein the OR-plane includes:
   a logic circuit generating a first logic sum signal based on a first subset of the logic product signals, generating a second logic sum signal based on a second subset of the logic product signals, and
   generating the logic sum signal by varying the first logic sum signal according to a logic state of the delayed second input signal and the second logic sum signal.

4. The programmable logic array of claim 3, wherein the logic circuit includes:
   a first output line transferring the first logic sum signal;
   a second output line transferring the second logic sum signal;
   a first enable circuit charging or discharging the first output line in synchronization with a first signal from the first subset of the logic product signals;
   a second enable circuit charging or discharging the second output line in synchronization with a first signal from the second subset of the logic product signals;
   a first transistor discharging the first output line based on a subset of the first subset of the logic product signals not including the first signal from the first subset;
   a second transistor discharging the second output line based on a subset of the second subset of the logic product signals not including the first signal of the second subset;
   a third enable circuit connecting the first output line and an output terminal, and charging or discharging the output terminal based on the first logic sum signal;
   a first discharge device discharging the output terminal based on the second logic sum signal; and
   a second discharge device discharging the output terminal based on the delayed second input signal.

5. The programmable logic array of claim 4, wherein the first enable circuit includes:
   a first inverter inverting the first signal from the first subset of the logic product signals;
   a first PMOS transistor including a gate receiving an output of the first inverter, a source receiving a power voltage, and a drain connected to an internal node;
   a first NMOS transistor including a drain connected to the output terminal, a source connected to a ground terminal, and a gate receiving the first signal from the first subset of the logic product signals;
   a NAND gate including a first input terminal receiving an output of the first inverter and a second input terminal connected to the internal node;
   a second PMOS transistor including a source receiving a power voltage, a drain connected to the output terminal, and a gate receiving an output of the NAND gate;
   a second inverter receiving an output of the NAND gate: and
   a second NMOS transistor including a gate receiving an output of the second inverter, a drain connected to the output terminal, and a source connected to the internal node.

6. The programmable logic array of claim 4, wherein the second enable circuit includes:
   a first inverter inverting the first signal from the second subset of the logic product signals;
   a first PMOS transistor including a gate receiving an output of the first inverter, a source receiving a power voltage, and a drain connected to an internal node;
   a first NMOS transistor including a drain connected to the output terminal, a source connected to a ground terminal, and a gate receiving the first signal from the second subset of the logic product signals;
   a NAND gate including a first input terminal receiving an output of the first inverter and a second input terminal connected to the internal node;
   a second PMOS transistor including a source receiving a power voltage, a drain connected to the output terminal, and a gate receiving an output of the NAND gate;
   a second inverter receiving an output of the NAND gate; and
   a second NMOS transistor including a gate receiving an output of the second inverter, a drain connected to the output terminal, and a source connected to the internal node.

7. The programmable logic array of claim 4, wherein the third enable circuit includes:
   a first inverter inverting the second logic sum signal;
   a first PMOS transistor including a gate receiving the first logic sum signal, a source receiving a power voltage, and a drain connected to an internal node;
   a first NMOS transistor including a drain connected to the output terminal, a source connected to a ground terminal, and a gate receiving an output of the first inverter;
   a NAND gate including a first input terminal receiving the first logic sum signal and a second input terminal connected to the internal node;
   a second PMOS transistor including a source receiving a power voltage, a drain connected to the output terminal, and a gate receiving an output of the NAND gate;
   a second inverter receiving an output of the NAND gate; and
   a second NMOS transistor including a gate receiving an output of the second inverter, a drain connected to the output terminal, and a source connected to the internal node.

8. The programmable logic array of claim 4, wherein the OR-plane further includes an inverter for inverting an output signal of the output terminal.

9. An OR-plane comprising:
   a receiving circuit receiving logic product signals and an input signal; and
   a generating circuit generating a logic sum signal based on the logic product signals, wherein the generating circuit includes,
      a first logic sum generating circuit generating a first logic sum signal based on a first subset of the logic product signals;
      a second logic sum generating circuit generating a second logic sum signal based on a second subset of the logic product signals; and a logic sum generating circuit generating the logic sum signal by varying the first logic sum signal according to a logic state of the input signal and the second logic sum signal.

10. The OR-plane of claim 9, wherein the first logic sum generating circuit includes:
a first output line transferring the first logic sum signal;
a first enable circuit charging or discharging the first output line in synchronization with a first signal from the first subset of the logic product signals;
a first transistor discharging the first output line based on a subset of the first subset of the logic product signals not including the first signal from the first subset; and
a third enable circuit connecting the first output line and an output terminal, and charging or discharging the output terminal based on the first logic sum signal; and
wherein the second logic sum generating circuit includes:
a second output line transferring the second logic sum signal;
a second enable circuit charging or discharging the second output line in synchronization with a first signal from the second subset of the logic product signals; and
a second transistor discharging the second output line based on a subset of the second subset of the logic product signals not including the first signal of the second subset; and
wherein the logic sum generating circuit comprises:
a first discharge device discharging the output terminal based on the second logic sum signal; and
a second discharge device discharging the output terminal based on the delayed second input signal.

11. The OR-plane of claim 10, further comprising an inverter for inverting an output signal of the output terminal.

12. A method of performing a logic function comprising:
receiving input signals including first input signals and a delayed second input signal inputted later than the first input signals;
generating logic product signals based on the first input signals;
generating a logic sum signal based on the logic product signals; and
varying the logic sum signal according to a logic state of the delayed second input signal.

13. The method of performing a logic function of claim 12, wherein generating a logic sum signal includes:
generating a first logic sum signal based on a first subset of the logic product signals; and
generating a second logic sum signal based on a second subset of the logic product signals; and
wherein the varying the logic sum signal step comprises:
varying the first logic sum signal according to a logic state of the delayed second input signal and the second logic sum signal.

14. The method of performing a logic function of claim 13, further comprising:
charging or discharging the first logic sum signal in synchronization with a first signal from the first subset of the logic product signals;
charging or discharging the second logic sum signal in synchronization with a first signal from the second subset of the logic product signals;
discharging the first logic sum signal based on a subset of the first subset of the logic product signals not including the first signal from the first subset;
discharging the second logic sum signal based on a subset of the second subset of the logic product signals not including the first signal of the second subset;
charging or discharging an output terminal based on the first logic sum signal;
discharging the output terminal based on the second logic sum signal; and
discharging the output terminal based on the delayed second input signal.

15. A programmable logic array comprising:
an AND-plane receiving first input signals and generating logic product signals based on the first input signals; and
an OR-plane receiving the logic product signals and a delayed second input signal and generating a logic sum signal based on the logic product signals, wherein the OR-plane includes,
a logic circuit generating a first logic sum signal based on a first subset of the logic product signals, generating a second logic sum signal based on a second subset of the logic product signals, and generating the logic sum signal by varying the first logic sum signal according to a logic state of the delayed second input signal and the second logic sum signal.

16. A method of performing a logic function comprising:
receiving input signals including first input signals and a delayed second input signal;
generating logic product signals based on the first input signals;
generating a logic sum signal based on the logic product signals; and
varying the logic sum signal according to a logic state of the delayed second input signal, wherein generating a logic sum signal includes,
generating a first logic sum signal based on a first subset of the logic product signals; and
generating a second logic sum signal based on a second subset of the logic product signals; and
wherein the varying the logic sum signal step includes,
varying the first logic sum signal according to a logic state of the delayed second input signal and the second logic sum signal.

* * * * *